United States Patent
Lammers et al.

(10) Patent No.: US 9,645,489 B2
(45) Date of Patent: May 9, 2017

(54) IMPRINT LITHOGRAPHY

(75) Inventors: Jeroen Herman Lammers, Eindhoven (NL); Sander Frederik Wuister, Eindhoven (NL); Roelof Koole, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 808 days.

(21) Appl. No.: 13/026,574

(22) Filed: Feb. 14, 2011

(65) Prior Publication Data
US 2011/0200795 A1 Aug. 18, 2011

Related U.S. Application Data

(60) Provisional application No. 61/305,012, filed on Feb. 16, 2010, provisional application No. 61/327,934, filed on Apr. 26, 2010.

(51) Int. Cl.
| | | |
|---|---|---|
| *B32B 33/00* | (2006.01) | |
| *B29C 59/02* | (2006.01) | |
| *G03F 7/00* | (2006.01) | |
| *B82Y 10/00* | (2011.01) | |
| *B82Y 40/00* | (2011.01) | |

(52) U.S. Cl.
CPC ............ *G03F 7/0002* (2013.01); *B82Y 10/00* (2013.01); *B82Y 40/00* (2013.01); *Y10T 428/24802* (2015.01)

(58) Field of Classification Search
CPC .............................. B29C 33/10; B29C 37/006
See application file for complete search history.

(56) References Cited

U.S. PATENT DOCUMENTS

| | | |
|---|---|---|
| 4,731,155 A | 3/1988 | Napoli et al. |
| 5,772,905 A | 6/1998 | Chou |
| 6,334,960 B1 | 1/2002 | Willson et al. |
| 2002/0115002 A1* | 8/2002 | Bailey et al. ............... 430/5 |
| 2004/0124566 A1 | 7/2004 | Sreenivasan et al. |
| 2005/0184436 A1* | 8/2005 | Jeong et al. ............ 264/496 |
| 2005/0274693 A1 | 12/2005 | Heidari et al. |

(Continued)

FOREIGN PATENT DOCUMENTS

WO 02/067055 8/2002

OTHER PUBLICATIONS

"Nano-imprint lithography; Templates, imprinting, and wafer pattern transfer," Dauksher et al., 2006, Microelectronic Engineering, 83, p. 929-932.*

(Continued)

*Primary Examiner* — Ian Rummel
(74) *Attorney, Agent, or Firm* — Pillsbury Winthrop Shaw Pittman LLP

(57) ABSTRACT

An imprint lithography template is disclosed. The imprint lithography template includes a plurality of pattern features extending from a plane of a body of the imprint lithography template, and away from that body, the pattern features to be used to apply a pattern into an imprintable medium. The imprint lithography template further includes a plurality of assist features in the form of recesses extending from the plane of that body of the imprint lithography template, and into that body. A method for forming the assist features in the imprint lithography template, using self-assembled block copolymers as an etch resist, is also disclosed.

25 Claims, 5 Drawing Sheets

(56) References Cited

U.S. PATENT DOCUMENTS

2007/0141191 A1\* 6/2007 Kruijt-Stegeman
 et al. .......................... 425/174.4
2008/0164638 A1\* 7/2008 Zhang .......................... 264/500
2009/0140458 A1 6/2009 Xu et al.

OTHER PUBLICATIONS

J. Haisma et al., "Mold-assisted nanolithography: A process for reliable pattern replication," J. Vac. Sci. Technol. B14 (6), Nov./Dec. 1996.
Ikuo Yoneda et al., "A study of filling process for UV nanoimprint lithography using a fluid simulation," Proc of SPIE, vol. 7271, 72712A-1-72712A-7.
Chuanbing Tang et al., "Evolution of Block Copolymer Lithography to Highly Ordered Square Arrays," Science, vol. 322, Oct. 17, 2008, pp. 429-432.
Min Park et al., "Block Copolymer Lithography: Periodic Arrays of $\sim 10^{11}$ Holes in 1 Square Centimeter," Science, vol. 276, May 30, 1997, pp. 1401-1404.

\* cited by examiner

IMPRINT LITHOGRAPHY

This application claims priority and benefit under 35 U.S.C. §119(e) to U.S. Provisional Patent Application Ser. No. 61/305,012, entitled "Imprint Lithography", filed on Feb. 16, 2010, and to U.S. Provisional Patent Application Ser. No. 61/327,934, entitled "Imprint Lithography", filed on Apr. 26, 2010. The contents of those applications are incorporated herein in their entirety by reference.

FIELD

The present invention relates to imprint lithography and in particular to an imprint lithography template suitable for use in imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g. nanometer sized features, e.g., less than or equal to 50 nm, less than or equal 25 nm or less than or equal to 10 nm sized features) that has gained increasing interest is so-called imprint lithography, which generally involves the use of a "stamp" (often referred to as an imprint lithography template or an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows around and about protrusions on the patterned surface, to adopt the topography of that patterned surface. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

When the imprint lithography template is in contact with a layer of imprintable medium, the imprintable medium does not instantaneously flow around protrusions of the imprint lithography template to adopt the topography of the imprint lithography template. Instead, this process (often referred to as the squeezing or squeeze process), can take a prolonged period of time (known as the squeeze or squeezing time), relative to other parts of the imprint lithography process such as the deposition of the imprintable medium, or the fixing of a pattern imprinted in that medium. The prolonged time required to undertake the squeezing process results in a reduction of the throughput of an imprint lithography process, and thus perhaps forms a barrier to commercial wide-scale use of imprint lithography.

SUMMARY

The driving power for the squeezing process is capillarity of a meniscus formed by the imprintable medium. A curvature introduced by contact angles on the substrate and the imprint lithography template surfaces results in a pressure difference between the imprintable medium and a surrounding gas (e.g. helium, often used in imprint lithography, or air) side of the meniscus. This pressure difference is balanced by both a pressure gradient in the imprintable medium, leading to viscous flow and squeezing, and an increased pressure on the gas. The gas is compressed, and slowly diffuses into the surroundings (e.g. the imprint lithography template, and/or the imprintable medium). Both compression and diffusion of the gas make room for the imprintable medium to flow (for example, in and around pattern features (i.e. protrusions) of the imprint lithography template), and allows the imprint lithography template to lower or be lowered towards the substrate. If the imprintable medium is provided in the form of a plurality of droplets, initially separately provided imprintable medium drops touch each other and trap gas bubbles between the imprintable medium, the imprint lithography template, and/or the substrate. These gas bubbles subsequently have to shrink to a substantially zero size for the squeezing process to be completed, and for the pattern formed in the imprintable medium to be fixed or frozen (e.g. by appropriate irradiation with UV radiation).

The slow movement of the imprintable medium, related to the slow diffusion of the gas into the imprintable medium and/or the imprint lithography template, results in a prolonged squeeze time and a negative impact on throughput.

It is an aim of an embodiment of the present invention to provide an imprint lithography template which obviates or mitigates one or more problems of the art, whether identified herein or elsewhere, or which provides an alternative to an existing lithography template. It is an aim of an embodiment of the present invention to provide an imprint lithography template which facilitates a shorter squeezing process, and thus a shorter squeezing time, in comparison with an existing imprint lithography template provided with the same or similar pattern features.

According to an aspect, there is provided an imprint lithography template, comprising: a plurality of pattern features extending from a plane of a body of the imprint lithography template, and away from that body, the pattern features to be used to apply a pattern into an imprintable medium; and a plurality of assist features in the form of recesses extending from the plane of a body of the imprint lithography template, and into that body. The assist features are not pattern features because the assist features do not contribute to the formation of a functional layer or topography in the imprintable medium or subsequently created device by the pattern features (e.g. after subsequent processing of an imprinted layer). The assist features are redundant in terms of providing such a functional layer or topography.

The assist features may be located between pattern features.

The pattern features may comprise a set of fine pattern features, and a set of coarse pattern features, the assist features being located between pattern features of the set of coarse pattern features.

The set of fine pattern features may comprise pattern features having one or more dimensions of the order of nanometers, and/or the set of coarse pattern features may comprise pattern features having one or more dimensions of the order of micrometers.

The recesses and/or pattern features may have one or more dimensions of the order of micrometers and/or nanometers.

A depth of the recesses may be less than a height of the pattern features (e.g. less than 50% of the height, less than 40% of the height, less than 30% of the height, less than 20% of the height, or less than 10% of the height).

The recesses may have a cross-section that is one or more of the following shapes: square, rectangular, circular, elliptical, triangular, a line or groove, rhombus or diamond, and/or cross-like.

The recess may have a cross-section which does not comprise of a line or a groove.

The pattern features, or the set of coarse pattern features, may comprise pillars.

The pillars may be suitable for use in the formation of contact holes in an imprintable medium during an imprint process.

The imprint lithography template may be formed from quartz or fused silica.

According to an aspect of the invention, there is provided a method for forming an imprint lithography template according to an embodiment of the invention described herein, the method comprising:

providing a layer of self-assembled polymer on the plane of the body of the imprint lithography template; and forming a plurality of assist features in the form of recesses extending from the plane of that body of the imprint lithography template, and into that body, using the layer of self-assembled polymer as a resist layer.

The layer of self-assembled polymer may be a continuous layer or may be in the form of one or more portions of layer provided between pattern features.

The self-assembled polymer may comprise a pattern of first and second domain types, wherein the first domain type is removed from the plane and the second domain type remains on the plane as an etch resist while etching of portions of the plane to form assist features is effected. Typically, the self-assembled polymer may be deposited as a self-assemble polymer layer, for instance by a process such as spin coating, and induced to self-assemble by application of a stimulus such as heating the polymer to a temperature above its glass transition temperature but below its order/disorder transition temperature.

The self-assemble polymer may be a block copolymer comprising at least two different block types which are self-assemble into an ordered polymer layer having the different block types associated into first and second domain types. Suitable block copolymers for use as self-assemble polymer include; but are not limited to, poly(styrene-block-methylmethacrylate), poly(styrene-block-2-vinylpyrididne), poly(styrene-block-butadiene), poly(styrene-block-ferrocenyldimethylsilane), polystyrene-block-ethylenoxide), poly(ethyleneoxide-block-isoprene). Although the description hereinafter may describe embodiments of the invention using diblock copolymers as examples, it will be apparent that an embodiment of the invention is suitable for use with triblock, tetrablock or other multi-block copolymers.

By the term "etch resist" it is meant that at least a portion of the second domain type remains on at least a portion of the plane while etching, such as chemical etching or e-beam etching, takes place, with the portion of second domain type acting as a shield to prevent etching of the portion of plane it covers.

The pattern features of the imprint lithography template may act as a graphoepitaxy template for assembly of the self-assembled polymer. The details of graphoepitaxy for alignment of patterns formed by self-assemble polymers are set out hereinafter.

According to an aspect, there is provided an imprint lithography method, comprising imprinting the imprint template according to an embodiment of the invention described herein into a layer of imprintable medium.

At least a part of the layer of imprintable medium acts as an etch stop layer during a subsequent etch process (e.g. a part of the layer of imprintable medium may be a part of the imprintable medium that flowed into the assist recesses).

According to an aspect, there is provided a device manufactured using an imprint lithography template according to an embodiment of the invention described herein and/or using an imprint lithography method according to an embodiment of the invention described herein.

BRIEF DESCRIPTION OF THE DRAWINGS

Specific embodiments of the invention will be described with reference to the accompanying Figures, in which:

FIG. 5 schematically depicts a perspective view of the imprint lithography template of FIGS. 3 and 4, but having an orientation which would be used to imprint the imprint lithography template into a layer of imprintable medium or the like.

DETAILED DESCRIPTION

Figure 1A:
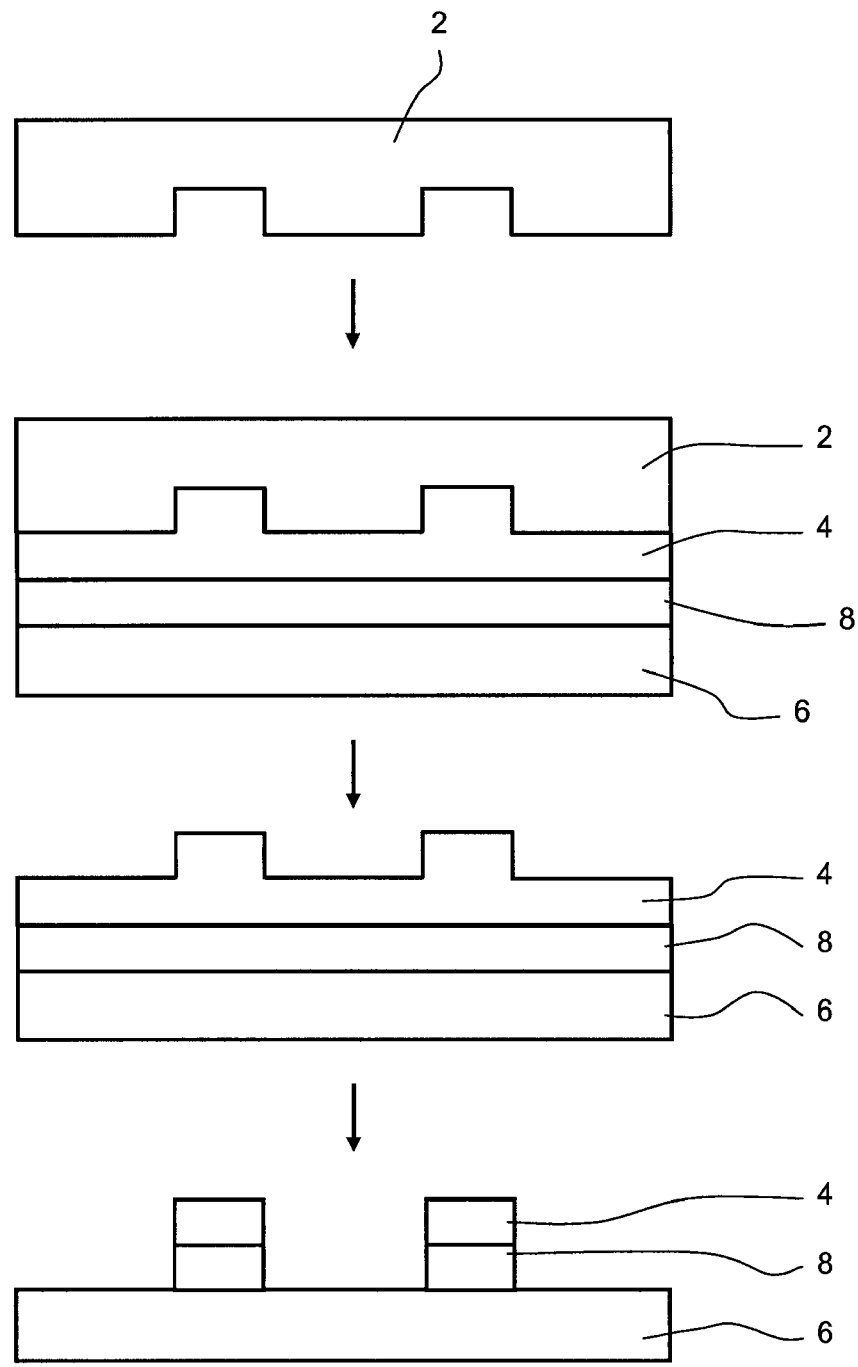
FIGS. 1a and 1b schematically depict examples of, respectively, hot imprint, and UV imprint lithography.
Figure 1B:
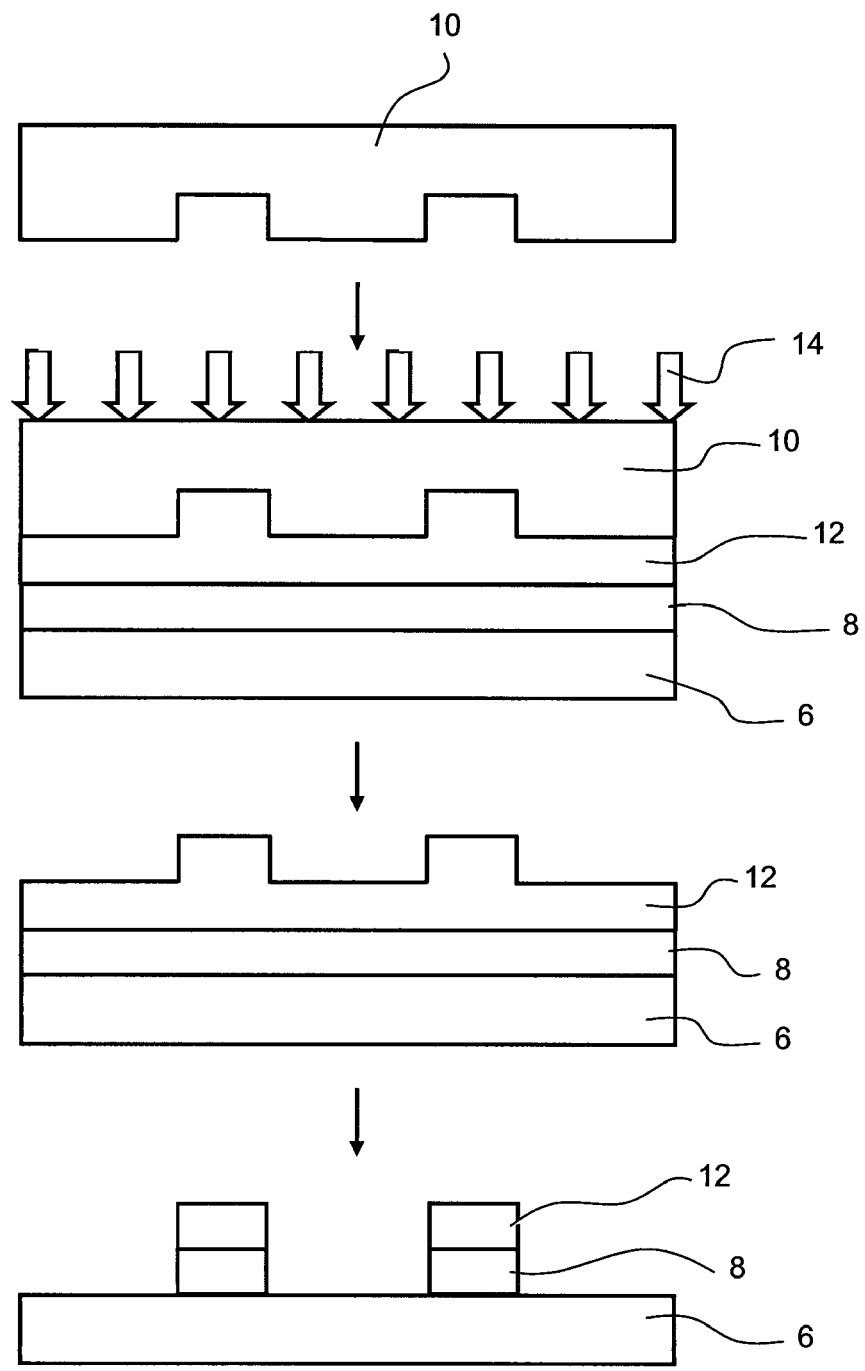

Examples of two known approaches to imprint lithography are schematically depicted in FIGS. 1a to 1b.

FIG. 1a shows an example of so-called hot imprint lithography (or hot embossing). In a typical hot imprint process, an imprint lithography template 2 is imprinted into a thermosetting or a thermoplastic imprintable medium 4, which has been provided on the surface of a substrate 6. The imprintable medium 4 may be, for example, resin. The imprintable medium 4, for instance, may be spin coated and baked onto the substrate surface or, as in the example illustrated, onto a planarization and transfer layer 8 of the substrate 6. When a thermosetting polymer resin 4 is used, the resin 4 is heated to a temperature such that, upon contact with the imprint lithography template 2, the resin 4 is sufficiently flowable to flow into the pattern features defined on the imprint lithography template 2. The temperature of the resin 4 is then increased to thermally cure (crosslink) the resin 4 so that it solidifies and irreversibly adopts the desired pattern. The imprint lithography template 2 may then be removed and the patterned resin 4 cooled. In hot imprint lithography employing a layer of thermoplastic polymer resin, the thermoplastic resin is heated so that it is in a freely flowable state immediately prior to imprinting with the imprint lithography template. It may be necessary to heat thermoplastic resin to a temperature considerably above the glass transition temperature of the resin. The imprint lithography template is brought together with the flowable resin and then cooled to below its glass transition temperature with the imprint lithography template in place to harden the pattern. Thereafter, the template is removed. The pattern will consist of the features in relief from a residual layer of the resin which may then be removed by an appropriate etch process to leave only the pattern features.

Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 1b shows an example of UV imprint lithography, which involves the use of a transparent or translucent imprint lithography template 10 which is transmissive to UV radiation and a UV-curable liquid as imprintable medium 12 (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill imprint lithography template pattern features. A quartz template 10 is applied to a UV-curable resin 12 in a similar manner to the process of FIG. 1a. However, instead of using heat or temperature cycling as in hot imprint lithography, the pattern is frozen by curing the imprintable medium 12 with UV radiation 14 that is applied through the quartz imprint lithography template 10 onto the imprintable medium 12. After removal of the imprint lithography template 10, the imprintable medium 12 is etched (and/or undergoes other further processing) to, for example provide pattern features in the substrate 6. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 2:
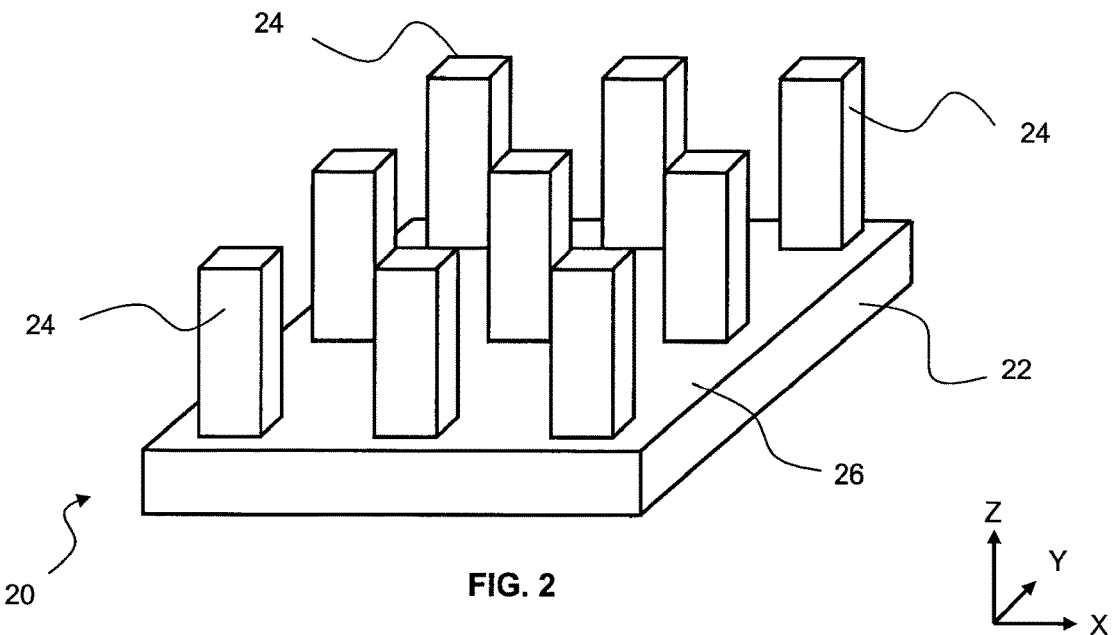
FIG. 2 schematically depicts a perspective and underside view of an imprint lithography template.

FIG. 2 schematically depicts a perspective underside view of an imprint lithography template 20 (for example, an imprint lithography template as described above in relation to FIGS. 1a and/or 1b). The imprint lithography template 20 comprises a (main) body 22 and a plurality of pattern features 24 which extend from a plane 26 (e.g. x-y plane) of the body 22.

In one embodiment, the pattern features 24 may take the form of, or comprise, pillars (as shown in FIG. 2). The pillars may be used, for example, in the formation of contact holes in an imprintable medium during a subsequent imprint of the imprint lithography template 20 into an imprintable medium.

The imprint lithography template 20, and in particular the pattern features 24, may be imprinted into a layer of imprintable medium in order to provide a related pattern in that layer of imprintable medium, as discussed above.

Imprintable medium will not instantaneously adopt the pattern defined by the pattern features 24. Instead, this process will take a relatively prolonged period of time (e.g. 5 seconds or more, or 10 seconds or more) due to the need for the imprintable medium to flow around and about the pattern features 24, and for any gas trapped in between the imprint lithography template 20 and the imprintable medium (and/or the substrate) to diffuse into the imprintable medium and/or the imprint lithography template 20 (and/or the substrate). This (squeeze) time may be increased if the pattern features are distributed in a relatively dense manner, which is often the case when the pattern features are pillars for use in the formation of contact holes in a subsequent imprint process. Similar problems can be encountered even when pattern features having other shapes or spatial distributions are formed on or by the imprint lithography template.

It is desirable to be able to reduce the time taken for an imprintable medium to flow around and about pattern features of an imprint lithography template, in order to reduce the time taken for the imprintable medium to adopt the topography of the pattern features (known as the squeeze time or squeezing time or the like). In accordance with an embodiment of the present invention, there is provided an imprint lithography template. The imprint lithography template comprises a plurality of pattern features extending from a plane of a body of the imprint lithography template, and away from that body (i.e. the pattern features are protrusions extending from that plane). The plurality of pattern features are constructed and arranged (i.e. configured) to be used to apply a desired pattern into an imprintable medium (for example to be in used in the formation of a functional pattern or layer or the like). The imprint lithography template is further provided with, and distinguished by, a plurality of assist features in the form of recesses extending from the plane of a body of the imprint template, and into that body. This means that the pattern features and assist features are at different planes or levels relative to one another. The assist features are given the prefix "assist" because these features assist the flow of imprintable medium around and about the pattern features when the pattern features are imprinted into a layer of imprintable medium, thus reducing the squeeze time discussed above. The assist features are not pattern features, because the assist features do not contribute to a functional layer or topography formed in the imprintable medium or a subsequent formed device. The assist features are redundant in terms of providing such a functional layer or topography.

An embodiment of the present invention will now be described, by way of example only, with reference to FIGS. 3 to 5. In those Figures, like features appearing in different Figures have been given the same reference numerals for consistency and clarity. The Figures have not been drawn to any particular scale.

Figure 3:
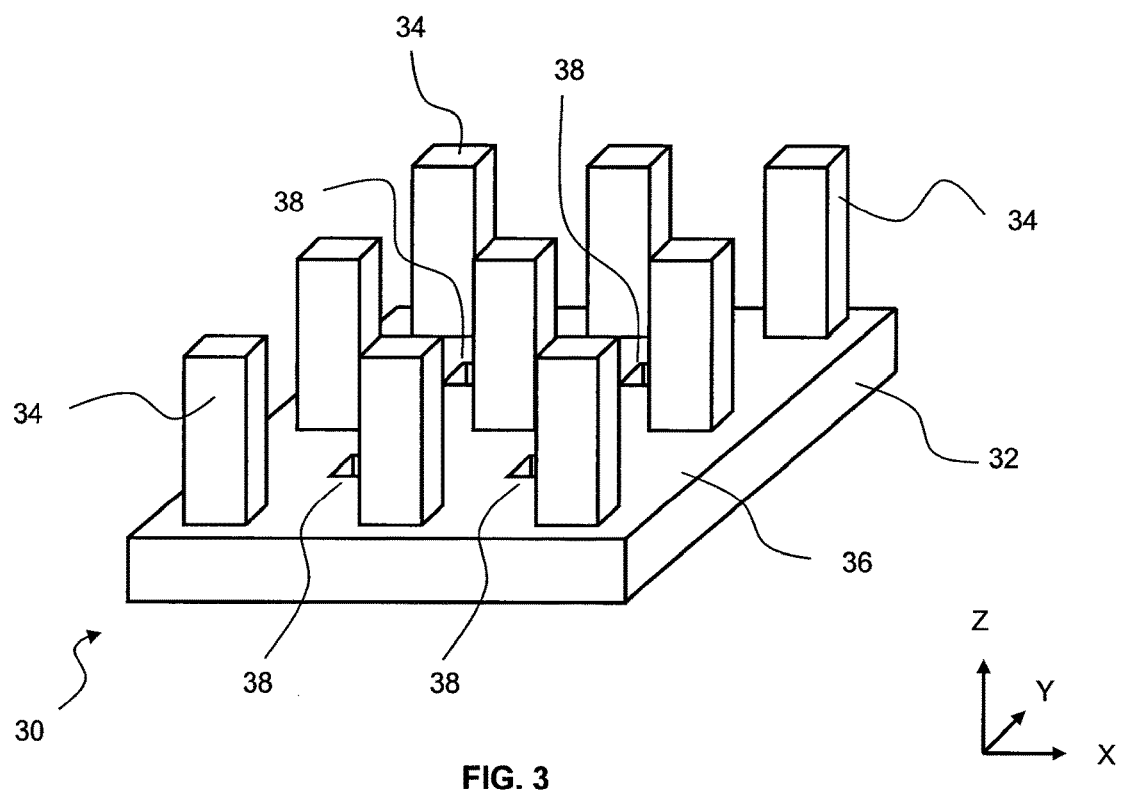
FIG. 3 schematically depicts a perspective underside view of an imprint lithography template in accordance with an embodiment of the present invention.

FIG. 3 schematically depicts a perspective underside view of an imprint lithography template 30 in accordance with an embodiment of the present invention. The imprint lithography template 30 comprises a body 32. A plurality of pattern features 34 (e.g. in this embodiment, in the form of pillars)

extend from a plane 36 (e.g. an x-y plane) of the body 32 of the imprint lithography template 30. The pattern features 34 are to be used to apply a pattern (e.g. a desired pattern) into an imprintable medium in a subsequent imprint of the imprint lithography template 30 into a layer of that imprintable medium. The pattern features 34 may thus be constructed and arranged to form a functional layer or topography or the like in a layer of imprintable medium, or be used in the process of forming a functional layer or topography or the like in a layer of imprintable medium (e.g. after subsequent processing of an imprinted layer), or a functional layer or topography or the like in a subsequently formed device.

The imprint lithography template 30 is further provided with a plurality of assist features in the form of recesses 38 (which may also be referred to as indentations, depressions, or the like). The recesses 38 extend from the plane 36 of the body 32 of the imprint lithography template 30, and into that body 32. The recesses 38 do not extend all the way through the body, and are not conduits to an opposite side of the imprint template or the like. In this embodiment, the recesses 38 have a square cross section and a flat base or bottom. Other cross-sectional shapes may be used, and the base or bottom may have a profile that is not flat.

The recesses 38 are described as "assist features" due to the manner in which they assist the flow of imprintable medium about and around the pattern features 34 when the imprint lithography template 30 and the pattern features 34 of that template 30 are imprinted into a layer of imprintable medium. This will be discussed in more detail below.

The assist features in the form of recesses 38 are located between the pattern features 34. This may alternatively or additionally be described as the recesses 38 being located in the same region (or area) of the imprint lithography template 30 as the pattern features 34. The recesses 38 may have one or more dimensions of the order of micrometers, for example a depth, width or length of the order of micrometers (e.g. less than 1000 µm, less than 500 less than 200 µm, less than 100 µm, less than 50 µm, less than 25, less than 10 µm, or less than 5 µm). The recesses may have dimension of the order of nanometers, for example a depth, width or length of the order of nanometers (e.g. less than 1000 nm, less than 500 nm, less than 200 nm, less than 100 nm, less than 50 nm, less than 25 nm, less than 10 nm, or less than 5 nm). The recesses 38 may constitute less than 90%, 80%, 70%, 60%, 50%, 40%, 30%, 20%, 10%, 5%, or 2% of an area of the plane 36 of the body 32 on which the pattern features 34 are provided or are formed.

The depth of the recesses 38 may be less than a height of the pattern features 34. If imprintable medium flows into the recesses 38 during an imprint, subsequent fixing of the imprintable medium in those recesses 38 will form a pattern feature in the imprintable medium. The pattern feature will be a redundant pattern feature, since the pattern feature formed by the recess 38 is not formed from one or more of the pattern features 34 of the imprint lithography template 30. If the recesses 38 have a relatively shallow depth, for example a depth which is less than the height of the pattern features 34, the redundant pattern features formed by the recesses 38 may not impact substantially on subsequent processing of the imprintable medium (or subsequently added layers). In other embodiments, the depth of the recesses may be the same as or greater than a height of the pattern features (e.g. if such criteria is advantageous, or if such criteria does not impact substantially on subsequent processing of the imprintable medium).

If, as discussed above, imprintable medium flows into the recesses 38 during an imprint, subsequent fixing of the imprintable medium in those recesses 38 will form a pattern feature in the imprintable medium (i.e. when the imprint lithography template 30 is released from the imprintable medium). At least a part of the fixed (layer of) imprintable medium may act as an etch stop layer during a subsequent etch process. Pattern features in the fixed imprintable medium caused by the imprinting of pattern features 34 of the imprint lithography template may be deep enough (i.e. the imprintable medium there may be thin enough) so that, during the etch process, the imprintable medium of the pattern feature is etched away so that an underlying part of the substrate may also be etched away. In contrast, some or all of the pattern features previously formed by imprintable medium flowing into the assist recesses 38 may be etched away during this etch, but will not result in any part of the substrate being etched away—i.e. the pattern features previously formed by imprintable medium flowing into the assist recesses 38 still act as an etch stop or barrier.

Figure 4:
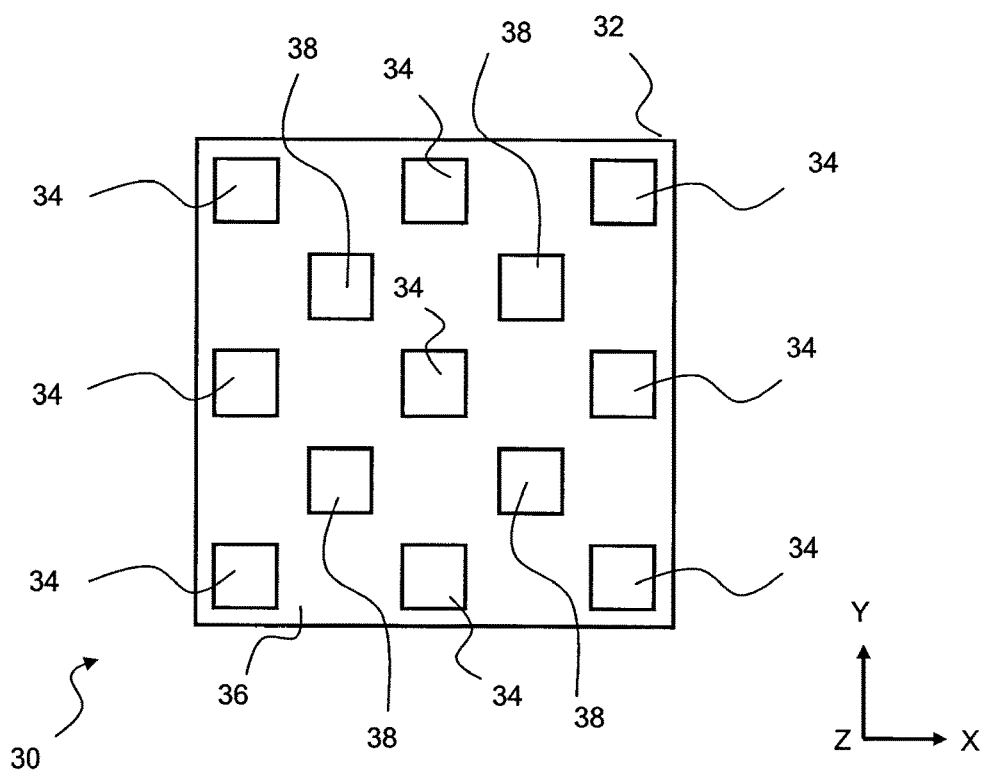
FIG. 4 schematically depicts an underside view of the imprint lithography template of FIG. 3.

FIG. 4 shows the imprint lithography template 30 of FIG. 3 in an underside view, for greater clarity.

Figure 5:
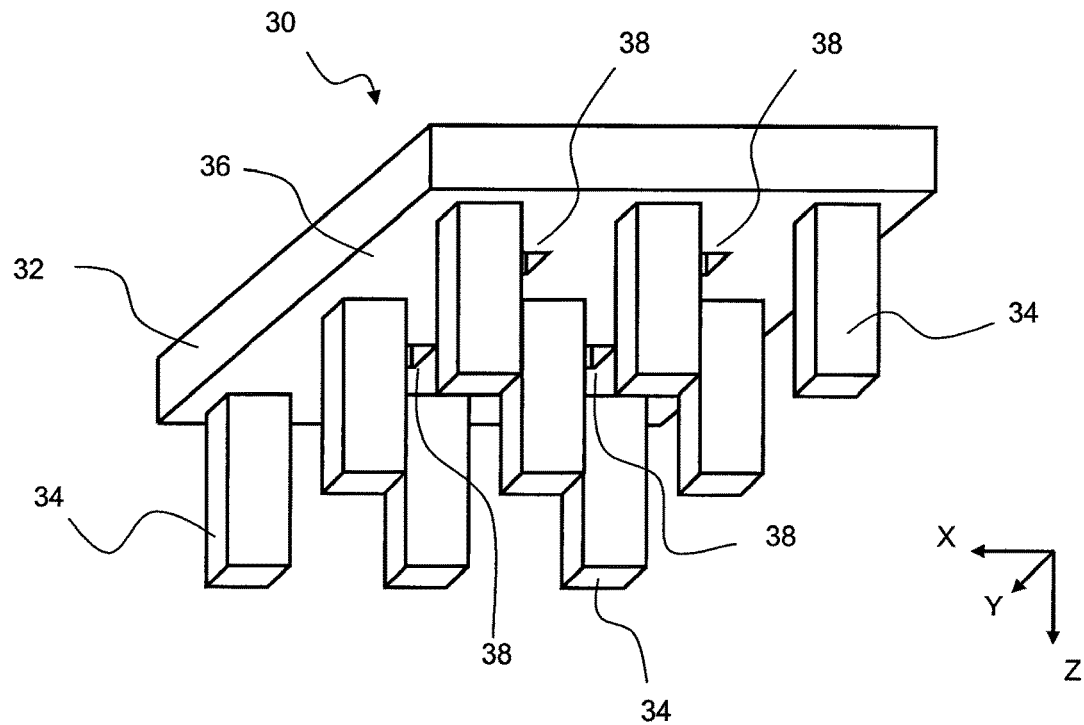
Figure 6:
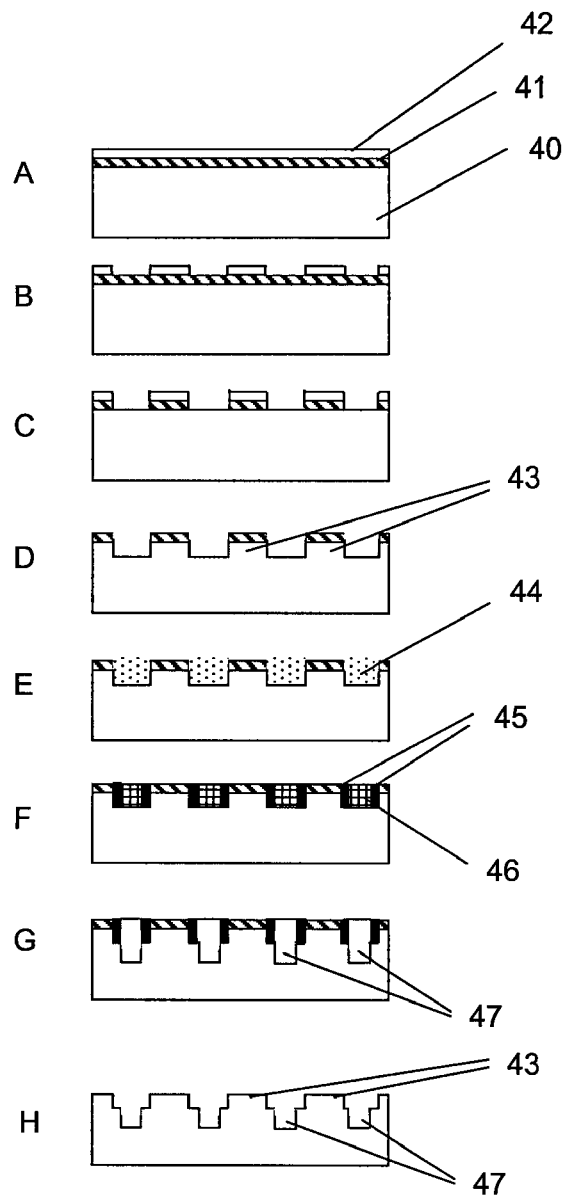
FIGS. 6A to 6H schematically depict cross sectional views of steps taken during a process including the use of self-assemble block copolymers to form an imprint lithography template according to an embodiment of the invention.

FIG. 5 schematically depicts the imprint lithography template of FIGS. 3 and 4 in perspective view, but now in an orientation suitable for imprinting into a layer of imprintable medium. When the layer of imprintable medium is brought into contact with the imprint lithography template 30, imprintable medium will attempt to flow around and about the pattern features 34 of the imprint lithography template 30, to adopt the topography of those pattern features 34. The assist features in the form of recesses 38 assist in the flow of the imprintable medium around and about the pattern features 34, and thus reduce the time taken for the imprintable medium to properly adopt the topography of the pattern features 34 (thus reducing the squeeze time, discussed above). It is believed that the assist features in the form of recesses 38 allow the imprintable medium to flow more readily about and around the pattern features for one or more of the following reasons:

(1) During an initial phase of the flow of imprintable medium when the imprint lithography template and imprintable medium are brought into proximity of one another, it is thought that the flow process is highly dependent on the thickness of the imprintable medium. The presence of the recesses 38 allows for an increase in the thickness of the layer of imprintable medium in the regions of each recess 38, thus reducing the local viscous stress, and thus increasing the flow rate overall.

(2) The presence of the recesses 38 allows for an increase in imprintable medium volume available to fill the recesses, which may also increase the flow rate.

(3) During a later or final phase of the squeezing process, diffusion of gas (e.g. helium) into the imprint lithography template or the imprintable medium is a limiting factor, and may reduce the flow rate of imprintable medium. The provision of the recesses 38 provides a larger volume and/or surface area of imprint lithography template and/or imprintable medium into which the gas may diffuse, thus increasing the diffusion rate, and reducing the squeeze time.

Since the recesses do not contribute to the formation of a functional layer or pattern or the like provided by the pattern features in the imprintable medium, it may not be important if gas bubbles or other defects are located or trapped in the recesses 38. This may allow, for example, fixing or freezing of the imprinted pattern to be undertaken after the imprintable medium has properly flowed around and about and adopted the topography of the pattern features, but before the imprintable medium has filled all of the recesses 38. This may result in a quicker squeeze time, and a higher throughput.

FIGS. 6A to 6H schematically depict sequential process steps used in the formation of an imprint template according to an embodiment of the invention.

FIG. 6A shows a quartz substrate 40 having a layer of chromium metal 41 provided thereon with a resist layer 42 provided on the chromium layer 41. In FIG. 6B, the resist has been partially removed using, for instance, electron beam lithography, to provide a pattern which is to be used to provide pattern features in the quartz substrate 40. The pattern is transferred into the chromium layer 41 by chemical etching to remove exposed chromium layer 41, to give the result shown in FIG. 6C. Further chemical etching leads to transfer of the pattern into the quartz substrate 40 forming pattern features in the form of pillars 43 extending from a plane of the body of the imprint lithography template as shown in FIG. 6D.

Self-assemble block copolymer is then provided (for instance by spin coating) to give portions of a layer, or a layer, of non-assembled block copolymer 44 in the regions between the pillars 43 and substantially filling these regions as shown in FIG. 6E. In FIG. 6F, the non-assembled block copolymer 44 is then annealed, for instance at temperature in excess of the glass transition temperature for the polymer, but below its order/disorder transition temperature, in order to give self-assembly. In this example, the block copolymer is a di-block copolymer which self-assembles into two domain types, with one domain type 45 having a higher chemical affinity for a wall of the pillars 43 than the other domain type 46. This difference in chemical affinity leads to graphoepitaxy of the self-assemble block copolymer as set out hereinbefore with the pillars acting as graphoepitaxy templates.

The resulting, aligned, self assembled block copolymer regions may then act as a pre-pattern for formation of assist features in the form of recesses. As shown in FIG. 6G, the domain 46 may be removed by chemical etching followed by further etching of the consequently denuded quartz below the removed domain 46 to provide assist features in the form of recesses 47 in the quartz substrate 40, extending from the plane into the body. Referring to FIG. 6H, the chromium 41 and domain 45 may then be removed leaving substantially only the quartz substrate 40.

Self-assemble polymers suitable for use in such an embodiment of the invention may be block copolymers comprising at least two blocks of differing chemical affinity, such as a di-block copolymer. Self-assemble polymers may assemble in cylindrical patterns (such as hexagonal) or may assemble, for instance, in lamellae or tetragonal patterns. See, for instance, Science vol. 322 (2008), pages 429 to 432.

The use of self-assembly of block copolymers (BCPs) has been considered as a potential method for improving the resolution for device lithography to better values than those obtainable by prior lithography methods.

Self-assemble block copolymers are materials useful in nanofabrication because they may undergo an order-disorder transition on cooling below a certain temperature (order-disorder transition temperature To/d) when they are in a state having molecular mobility (i.e. at a temperature above the glass transition temperature Tg for the polymer) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification the chemical compositions of the blocks of the copolymers.

The feasibility of using thin films of block copolymers in forming resist templates for etching of substrates was demonstrated by Chaikin and Register, et al., Science 276, 1401 (1997). Dense arrays of dots and holes with dimensions of 20 nm were transferred from a thin film of poly(styrene-bock-isoprene) to silicon nitride substrates.

Block copolymers comprise different blocks of identical monomers arranged side-by side along the polymer chain. Each block may contain many monomers of its respective type. So, for instance, an A-B block copolymer may have a plurality of type A monomers in each A block and a plurality of type B monomers in each B block. An example of a suitable block copolymer is, for instance, a polymer having covalently linked blocks of polystyrene monomers (hydrophobic block) and polymethylmethacrylate (PMMA) monomers (hydrophilic block). Other block copolymers with blocks of differing lyophobicity (e.g., hydrophobicity)/lyophilicity (e.g., hydrophilicity) may be useful. For instance triblock copolymers may be useful. The blocks are connected to each other by covalent links in a linear or branched fashion (e.g. star or branched configuration).

Block copolymers may form many different phases upon self-assembly, dependent upon the volume fractions of the blocks, degree of polymerization within each block type (i.e. number of monomers of each respective type within each respective block), the optional use of solvents and surface interactions. When applied in thin films, the geometric confinement may pose additional boundary conditions that may limit the numbers of phases. In general only spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

The self-assembled block copolymer phases may orient with symmetry axes parallel or perpendicular to the substrate upon which they are provided, and lamellar and cylindrical phases are most interesting for lithography applications, as they may form line and space patterns and hole arrays, respectively, and may provide good contrast when one of the domain types is subsequently removed or etched.

Two methods used to guide self-assembly of block copolymers onto surfaces are graphoepitaxy and chemical pre-patterning. In the graphoepitaxy method, self-organization of block copolymers is guided by topological pre-patterning of the substrate. Self-aligned block copolymers can form parallel linear patterns with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer patterns subdividing the spacing of pre-patterns on the substrate. Hence, in the embodiment shown in FIG. 6, the pattern features act as a graphoepitaxy template for self-assembly.

In the chemical pre-patterning method, the self-assembly of block copolymer domains is guided by chemical patterns on the substrate. Chemical affinity between the chemical patterns and at least one of the types of copolymer blocks within the polymer chain may result in the precise placement of one of the domain types onto a corresponding region of the chemical pattern on the substrate. For instance if the block copolymer is a di-block copolymer with A and B blocks, where A is hydrophilic and B is hydrophobic in nature, and the chemical pattern comprises hydrophobic regions on a hydrophilic surface, the B domains may preferentially assemble onto the hydrophobic regions. As with the graphoepitaxy method of alignment, the resolution may be improved over the resolution of the patterned substrate by the block copolymer patterns subdividing the spacing of the pre-patterned features on the substrate (so-called density multiplication). Chemical pre-patterning is not limited to linear pre-patterns; for instance the pre-pattern may be in the form of a 2-D array of dots suitable as a pattern for use with a cylindrical phase-forming block copolymer. Graphoepitaxy and chemical pre-patterning may be used to guide the self-organization of lamellar, cylindrical phases.

In a typical process to implement the use of block copolymer self assembly in nanofabrication, a substrate may be modified with an orientation control layer to induce the desired orientation of the self-assembly pattern in relation to the substrate. For some block copolymers used in self-assemble polymer layers, there may be a preferential interaction between one of the blocks and the substrate surface that may result in orientation. For instance, for a polystyrene/PMMA block copolymer, the PMMA block will preferentially wet (i.e. have a high chemical affinity with) oxide surfaces and this may be used to induce the self-assembled pattern to lie oriented parallel to the plane of the surface. Perpendicular orientation may be induced, for instance, by rendering the substrate surface neutral to both blocks, in other words having a similar chemical affinity for each block, such that both blocks wet the surface in a similar manner. Neutral surfaces may be created by use of random copolymer brushes which are covalently linked to the substrate by reaction of a hydroxyl terminal group, or some other reactive end group, to oxide at the substrate surface. Alternatively, crosslinkable random copolymers or appropriate silanes can be used to render surfaces neutral by acting as an intermediate layer between the substrate surface and the layer of self-assemble polymer. An intermediate layer between the substrate and the layer of self-assemble block polymer, onto which the self-assemble block polymer layer is directly deposited, is referred to hereinafter as a primer layer. The primer layer may be provided with gaps to permit one of the block types of the self-assemble layer to come into direct contact with the substrate below the primer layer. This may be useful for anchoring or aligning a domain of a particular block type of the self-assemble polymer layer to the substrate.

The substrate may be additionally or alternatively provided with topological or chemical pre-patterns as set out above to guide the self-assembly pattern. A thin layer of self-assemble block copolymer is typically deposited on the substrate, typically onto an intermediate neutral or primer layer as set out above. A suitable method for deposition is spin coating as it is capable of providing a well defined, uniform, thin layer. A suitable layer thickness for a deposited block copolymer film is approximately 10 to 100 nm. Following deposition of the block copolymer film, the film may still be disordered or only partially ordered and additional steps may be needed to promote and/or complete self-assembly, for instance heating to a temperature above the glass transition temperature but below the order/disorder transition temperature for the block copolymer.

The block copolymers are self-assembled into a highly ordered regular pattern. The self-assembly process typically occurs most readily at a temperature above the glass-transition temperature and below the order-disorder temperature for the block copolymer.

During use of the imprint lithography template described herein for imprint lithography, the rate at which imprintable medium flows around and about the pattern features to adopt the topography of those pattern features may depend on the dimensions of those pattern features and the space in between adjacent pattern features, and the like. For instance, if the pattern features and/or the distance between those pattern features have dimensions of the order of micrometers, and are thus 'coarse', then the flow rate of imprintable medium may be reduced in comparison with pattern features which have dimensions or degrees of separation of the order of nanometers (referred to as 'fine' features). Smaller pattern features, or a smaller separation between pattern features, may increase any capillary effect and thus increase the rate at which imprintable medium flows into, or is drawn into, a void or the like between those pattern features. For this reason, it may not be necessary to provide the assist features described above for all types or sizes of pattern features, or for all regions of an imprint lithography template. Thus, in one example, an imprint lithography template may comprise one or more sets of fine pattern features (e.g. having dimensions or separations of the order of nanometers) and one or more sets of coarse pattern features (e.g., having dimensions or degrees of separation of the order of micrometers). The assist features may be located between pattern features of the set (or sets) of coarse pattern features to assist the flow of the imprintable medium around and about those coarse pattern features. There may be no need to provide the assist features between pattern features of the set (or sets) of fine pattern features, for the reasons given above. For fine pattern features, there may be more imprintable medium than is required to adopt the topography of those features. Assist features may be located between or around fine pattern features to act as wells or reservoirs for excess imprintable medium. This may be advantageous, since the excess imprintable medium may otherwise reduce the flow rate of imprintable medium around those fine pattern features, or other (e.g. coarse) pattern features on the imprint template. Even in this embodiment, the assist features thus still assist the flow of imprintable medium.

'Coarse' features may, for example, have one or more dimensions of the order of micrometers, for example a height, width or length of the order of micrometers, such as less than 1000 µm, less than 500 µm, less than 200 µm, less than 100 µm, less than 50 µm, less than 25 µm, less than 10 µm, or less than 5 µm. 'Fine' features may have one or more dimensions of the order of nanometers, for example a height, width or length of the order of nanometers such as less than 1000 nm, less than 500 nm, less than 200 nm, less than 100 nm, less than 50 nm, less than 25 nm, less than 10 nm, or less than 5 nm. In integrated circuit (IC) manufacturing, for example, 'fine' pillars may be provided (for the formation of 'fine' contact holes) in conjunction with wider 'coarse' features in the form of lines.

In the embodiment described above, the pattern features are shown as pillars. These pillars may be constructed and arranged (e.g. be configured and/or suitable) for use in the formation of contact holes in an imprintable medium during a subsequent imprint process. Assist features as described above may have particular use when used in conjunction with pillars for use in the formation of contact holes. This is because pillars configured for such use usually have a spatial density and one or more dimensions (e.g. the separation and/or dimensions being of the order of micrometers) which will result in a prolonged squeeze time. An embodiment of the invention, as described above, is also applicable to pattern features having other shapes, sizes and/or dimensions.

In FIG. 4, the recesses have been shown as having a square cross-section. The recesses may have other cross-sectional shapes, for example circular, elliptical, rectangular, triangular, rhombus or diamond, cross-like, or the like. The recesses might even be provided in the form of one or more lines or grooves. The lines or grooves may intersect. The recesses may be crosses or the like provided in the form of intersecting grooves in the imprint lithography template.

In FIG. 4, the recesses have been shown as being located laterally offset (e.g. in both the y and x directions in FIG. 4) from the locations of the pattern features. This may be desirable in order to draw the imprintable medium into the regions between the pattern features, and/or to facilitate the flow of imprintable medium into the regions between the pattern features. This lateral offset may be desirable since the recesses may be provided more easily due to their lateral offset, and the offset may allow for greater tolerance in the positioning of the recesses. However, the recesses may be located in any appropriate location which results in the squeeze time being reduced.

A single recess may reduce the squeeze time. Further recesses may further reduce the squeeze time. At least one recess in the vicinity of each pattern feature, and/or between neighboring or adjacent pattern features, may be optimal.

The imprint lithography template, described above, may be formed from any suitable material, such as quartz or fused silica. Quartz or fused silica, or the like, may be desirable due to their relative transparency to UV radiation. As described above, UV radiation may be used to fix or freeze a pattern provided in a layer of imprintable medium by pattern features of that imprint lithography template. Furthermore, quartz and fused silica may be particular porous to, for example, helium which may be used as part of the imprint lithography process and may form the gas, or gas bubbles or the like discussed above.

In an embodiment, there is provided an imprint lithography template, comprising: a plurality of pattern features extending from a plane of a body of the imprint lithography template, and away from that body, to be used to apply a pattern into an imprintable medium; and a plurality of assist features in the form of recesses extending from the plane of that body of the imprint lithography template, and into that body.

In an embodiment, the assist features are located between pattern features. In an embodiment, the pattern features comprise a set of fine pattern features, and a set of coarse pattern features, the assist features being located between pattern features of the set of coarse pattern features. In an embodiment, the set of fine pattern features comprises pattern features having one or more dimensions of the order of nanometers, and/or wherein the set of coarse pattern features comprises pattern features having one or more dimensions of the order of micrometers. In an embodiment, the recesses and/or pattern features have one or more dimensions of the order of micrometers and/or nanometers. In an embodiment, a depth of recesses is less than a height of the pattern features. In an embodiment, the recesses have a cross-section that is one or more of the following shapes: square, rectangular, circular, elliptical, triangular, a line or groove, rhombus or diamond, and/or cross-like. In an embodiment, the recesses have a cross-section that does not comprise of a line or of a groove. In an embodiment, the pattern features comprise pillars. In an embodiment, the pillars are suitable for use in the formation of contact holes in an imprintable medium during an imprint process. In an embodiment, the imprint lithography template is formed from quartz or fused silica.

In an embodiment, there is provided a method comprising: providing a layer of self-assembled polymer on a plane of a body of an imprint lithography template having pattern features; and forming a plurality of assist features in the form of recesses extending from the plane of that body of the imprint lithography template, and into that body, using the layer of self-assembled polymer as a resist layer.

In an embodiment, the self-assembled polymer comprises a pattern of first and second domain types, and wherein the first domain type is removed from the plane and the second domain type remains on the plane as an etch resist while etching of portions of the plane to form assist features is effected. In an embodiment, the pattern features act as a graphoepitaxy template for assembly of the self-assembled polymer. In an embodiment, the method further comprises imprinting the imprint lithography template into a layer of imprintable medium. In an embodiment, at least a part of the layer of imprintable medium acts as an etch stop layer during a subsequent etch process. In an embodiment, the plurality of pattern features extend from the plane of the body of the imprint lithography template, and away from that body, and are to be used to apply a pattern into an imprintable medium.

In an embodiment, there is provided at least a part of a device manufactured using an imprint lithography template, the template having a plurality of pattern features extending from a plane of a body of the imprint lithography template, and away from that body, to be used to apply a pattern into an imprintable medium, and having a plurality of assist features in the form of recesses extending from the plane of that body of the imprint lithography template, and into that body, and/or manufactured using a method comprising providing a layer of self-assembled polymer on a plane of a body of an imprint lithography template having pattern features, forming a plurality of assist features in the form of recesses extending from the plane of that body of the imprint lithography template, and into that body, using the layer of self-assembled polymer as a resist layer, and imprinting the imprint lithography template into the layer of imprintable medium.

An embodiment of the present invention relates to an imprint lithography template suitable for use in an imprint lithography apparatus and Method. The imprint lithography template, and/or imprint lithography apparatus and/or method may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as one or more planarization layers and/or anti-reflection coating layers.

In use, an imprint lithography template (e.g. the imprint lithography template or templates according to an embodiment of the present invention) may be held by an imprint lithography template holder. The imprint lithography template holder may hold the imprint lithography template using one of a number of different mechanisms, for example using electrostatic or magnetic force, mechanical force (e.g. via the use of a piezoelectric element or the like) or by vacuum force. The imprint lithography template may be moved by appropriate movement of the imprint lithography template holder. In use, a substrate may be held by a substrate holder. The substrate holder may hold the substrate using one of a number of different mechanisms, for example using electrostatic or magnetic force, mechanical force (e.g. a clamp or the like) or by vacuum force. The substrate may be moved by appropriate movement of the substrate holder.

In the above embodiments, a single imprint lithography template, a single imprint lithography template holder, a single substrate holder and a single substrate is provided, and for example in a single chamber. In other embodiments, more than one imprint lithography template, more than one imprint lithography template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders.

In an embodiment, there is provided an apparatus that includes a plurality (e.g. 2, 3, or 4) of imprint lithography template holders and/or templates. In an embodiment, there is provided an apparatus configured to use one template holder and/or imprint lithography template per substrate holder. In an embodiment, there is provided an apparatus configured to use more than one template holder and/or imprint lithography template per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint lithography template. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The described and illustrated embodiments are to be considered as illustrative and not restrictive in character, it being understood that only the preferred embodiments have been shown and described and that all changes and modifications that come within the scope of the inventions as defined in the claims are desired to be protected. It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. An imprint lithography template, comprising:
   a plurality of separate pattern features extending from an external surface of a body of the imprint lithography template, and away from that body, to be used to apply a pattern into an imprintable medium; and
   a plurality of assist features in the form of recesses extending from the surface of that body of the imprint lithography template, and into that body, wherein each of the assist features is located among pattern features that collectively surround each respective assist feature and at least part of the surface extends from the pattern features to the plurality of recesses.

2. The imprint lithography template of claim 1, wherein the pattern features comprise a set of fine pattern features, and a set of coarse pattern features, the assist features being located between pattern features of the set of coarse pattern features and not between pattern features of the set of fine pattern features.

3. The imprint lithography template of claim 2, wherein the set of fine pattern features comprises pattern features having one or more dimensions of the order of nanometers, and/or wherein the set of coarse pattern features comprises pattern features having one or more dimensions of the order of micrometers.

4. The imprint lithography template of claim 1, wherein the recesses and/or pattern features have one or more dimensions of the order of micrometers and/or nanometers.

5. The imprint lithography template of claim 1, wherein a depth of the recesses from the surface is less than a height of the pattern features from the surface.

6. The imprint lithography template of claim 1, wherein the recesses have a cross-section that does not comprise of a line or of a groove.

7. The imprint lithography template of claim 1, wherein the pattern features comprise pillars.

8. The imprint lithography template of claim 7, wherein the pillars are suitable for use in the formation of contact holes in an imprintable medium during an imprint process.

9. The imprint lithography template of claim 1, wherein the imprint lithography template is formed from quartz or fused silica.

10. The imprint lithography template of claim 1, wherein each of the plurality of pattern features define at least a portion of a layer or topography for a same device formed by, or using, the imprintable medium.

11. The imprint lithography template of claim 1, wherein a depth, cross-sectional dimension or location of each assist feature is selected such that the assist features do not contribute to formation by the pattern features of a functional layer or topography in the imprintable medium or a subsequently created device.

12. The imprint lithography template of claim 1, wherein each recess has an opening defined within, and enclosed, by the surface, and each recess is blocked off except for the respective recess opening.

13. An imprint lithography template, comprising:
   a plurality of pattern features extending from a surface of a body of the imprint lithography template, and away from that body, to be used to apply a pattern into an imprintable medium; and
   a plurality of assist features in the form of recesses extending from the surface of that body of the imprint lithography template, and into that body, wherein each of the assist features is located among pattern features that collectively surround each respective assist feature, each recess has an opening defined within, and enclosed, by the surface, and each recess is blocked off except for the respective recess opening.

14. The imprint lithography template of claim 13, wherein the recesses and/or pattern features have one or more dimensions of the order of micrometers and/or nanometers and wherein each of the plurality of pattern features define at least a portion of a layer or topography for a same device formed by, or using, the imprintable medium.

15. The imprint lithography template of claim 13, wherein the recesses and/or pattern features have one or more dimensions of the order of micrometers and/or nanometers and wherein a depth, cross-sectional dimension or location of each assist feature is selected such that the assist features do not contribute to formation by the pattern features of a functional layer or topography in the imprintable medium or a subsequently created device.

16. The imprint lithography template of claim 13, wherein a depth of the recesses from the plane is less than a height of the pattern features from the plane.

17. A device manufacturing method comprising:
imprinting an imprint lithography template into a layer of imprintable medium, the imprint lithography template, comprising a plurality of pattern features extending from an external surface of a body of the imprint lithography template, and away from that body, to be used to apply a pattern into the imprintable medium, and a plurality of assist features in the form of recesses extending from the surface of that body of the imprint lithography template, and into that body, wherein each of the assist features is located among pattern features that collectively surround each respective assist feature and at least part of the surface extends from the pattern features to the plurality of recesses.

18. The method of claim 17, wherein the recesses and/or pattern features have one or more dimensions of the order of micrometers and/or nanometers and further comprising etching the imprinted imprintable medium wherein at least a part of the layer of imprintable medium acts as an etch stop layer during the etching.

19. The method of claim 17, wherein a depth of the recesses from the surface is less than a height of the pattern features from the surface.

20. The method of claim 17, wherein each of the plurality of pattern features define at least a portion of a layer or topography for a same device formed by, or using, the imprintable medium.

21. The method of claim 20, wherein a depth, cross-sectional dimension or location of each assist feature is such that the assist features do not contribute to formation by the pattern features of a functional layer or topography in the imprintable medium or a subsequently created device.

22. A device manufacturing method comprising:
imprinting an imprint lithography template into a layer of imprintable medium, the imprint lithography template comprising a plurality of pattern features extending from a surface of a body of the imprint lithography template, and away from that body, to be used to apply a pattern into the imprintable medium, and a plurality of assist features in the form of recesses extending from the surface of that body of the imprint lithography template, and into that body, wherein each of the assist features is located among pattern features that collectively surround each respective assist feature, each recess has an opening defined within, and enclosed, by the surface, and each recess is blocked off except for the respective recess opening.

23. The method of claim 22, wherein the recesses and/or pattern features have one or more dimensions of the order of micrometers and/or nanometers and further comprising etching the imprinted imprintable medium wherein at least a part of the layer of imprintable medium acts as an etch stop layer during the etching.

24. The method of claim 23, wherein each of the plurality of pattern features define at least a portion of a layer or topography for a same device formed by, or using, the imprintable medium.

25. The method of claim 24, wherein a depth, cross-sectional dimension or location of each assist feature is such that the assist features do not contribute to formation by the pattern features of a functional layer or topography in the imprintable medium or a subsequently created device.

* * * * *

UNITED STATES PATENT AND TRADEMARK OFFICE
CERTIFICATE OF CORRECTION

PATENT NO. : 9,645,489 B2  
APPLICATION NO. : 13/026574  
DATED : May 9, 2017  
INVENTOR(S) : Jeroen Herman Lammers et al.

Page 1 of 1

It is certified that error appears in the above-identified patent and that said Letters Patent is hereby corrected as shown below:

On the Title Page

On Page 2, Item (56) References Cited - Other Publications, Lines 10-12:
Replace "Min Park et al., "Block Copolymer Lithography: Periodic Arrays of ~$10^{11}$ Holes in 1 Square Centimeter," Science, vol. 276, May 30, 1997, pp. 1401-1404."
With --Miri Park et al., "Block Copolymer Lithography: Periodic Arrays of ~$10^{11}$ Holes in 1 Square Centimeter," Science, vol. 276, May 30, 1997, pp. 1401-1404.--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*